(12) United States Patent
Doy et al.

(10) Patent No.: US 7,183,857 B2
(45) Date of Patent: Feb. 27, 2007

(54) SINGLE SUPPLY DIRECT DRIVE AMPLIFIER

(75) Inventors: Tony Doy, Sunnyvale, CA (US); Ronald Koo, Mountain View, CA (US)

(73) Assignee: Maxim Integrated Products Inc., Sunnyvale, CA (US)

( * ) Notice: Subject to any disclaimer, the term of this patent is extended or adjusted under 35 U.S.C. 154(b) by 153 days.

(21) Appl. No.: 11/039,386

(22) Filed: Jan. 18, 2005

(65) Prior Publication Data

US 2005/0184807 A1    Aug. 25, 2005

Related U.S. Application Data

(63) Continuation-in-part of application No. 10/056,994, filed on Jan. 24, 2002, now Pat. No. 7,061,327.

(60) Provisional application No. 60/592,868, filed on Jul. 29, 2004.

(51) Int. Cl.
    *H03F 3/04* (2006.01)
(52) U.S. Cl. .................................. 330/297; 330/296

(58) Field of Classification Search ................ 330/297, 330/296, 285, 307; 307/256.1; 381/120
See application file for complete search history.

(56) References Cited

U.S. PATENT DOCUMENTS

| 5,289,137 A | * | 2/1994 | Nodar et al. ................ 330/296 |
| 5,666,355 A | * | 9/1997 | Huah et al. ................. 370/311 |
| 6,011,440 A | * | 1/2000 | Bell et al. .................... 330/297 |

* cited by examiner

*Primary Examiner*—Henry Choe
(74) *Attorney, Agent, or Firm*—Perkins Coie LLP (57) ABSTRACT

A driver amplifier operative from a single DC voltage supply, coupled directly to the output load without the need for DC coupling capacitors used for preventing DC reaching the output load. An onboard power supply generates a negative voltage rail that powers the output amplifiers, allowing driver amplifier operation from both positive and negative rails. Since the amplifiers can be biased at ground potential (0 volts), no significant DC voltage exists across the load and the need for DC coupling capacitors is eliminated.

20 Claims, 10 Drawing Sheets

SINGLE SUPPLY DIRECT DRIVE AMPLIFIER

CROSS-REFERENCE TO RELATED APPLICATIONS

The present application is a continuation-in-part of Tony Doy's U.S. utility patent application Ser. No. 10/056,994, filed Jan. 24, 2002, now U.S. Pat. No. 7,061,327 entitled SINGLE SUPPLY HEADPHONE DRIVER/CHARGE PUMP COMBINATION, which is incorporated herein by reference. The present application also claims priority to Doy's U.S. provisional application No. 60/592,868, filed Jul. 29, 2004, entitled SINGLE SUPPLY DIRECT DRIVE AMPLIFIER, which is incorporated herein by reference.

FIELD OF THE INVENTION

This invention relates generally to amplifier circuits and more particularly to single supply direct drive amplifier circuits.

BACKGROUND OF THE INVENTION

Direct drive amplifiers are used in a variety of applications. These include a host of applications where miniaturization is important, such as video and audio applications. The following background discussion focuses on prior art related to headphones, but the limitations described below are common to all prior art direct drive amplifiers. In particular, prior art direct drive amplifiers that operate from a single power supply require series output capacitors or other costly and space inefficient schemes.

Figure 1A:
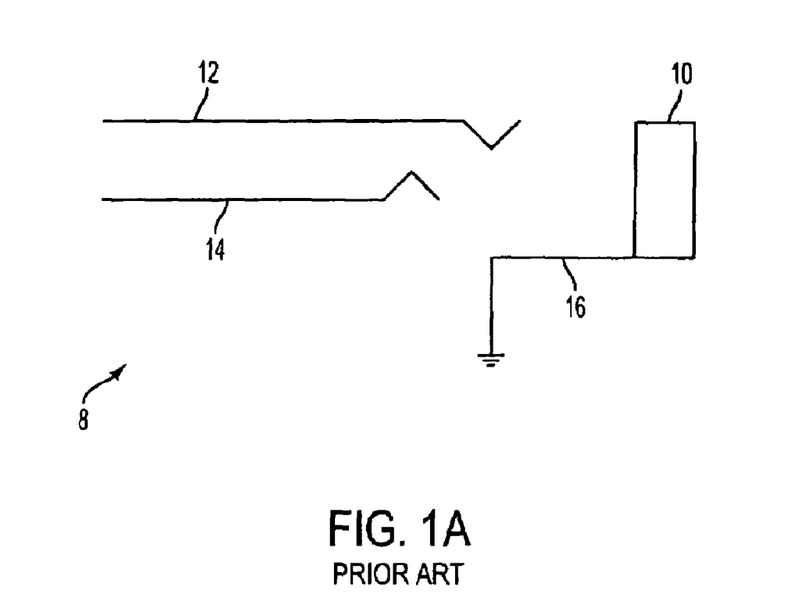
FIG. 1A illustrates a typical headphone connectivity diagram.

PRIOR ART FIG. 1A illustrates a typical headphone connectivity diagram 8. The right headphone lead 12 and the left headphone lead 14 couple to the right and left headphone speakers respectively represented here by a headphone load 10 to the rest of the system. Each headphone load 10 as well as the overall system is connected to a common ground 16.

Figure 1B:
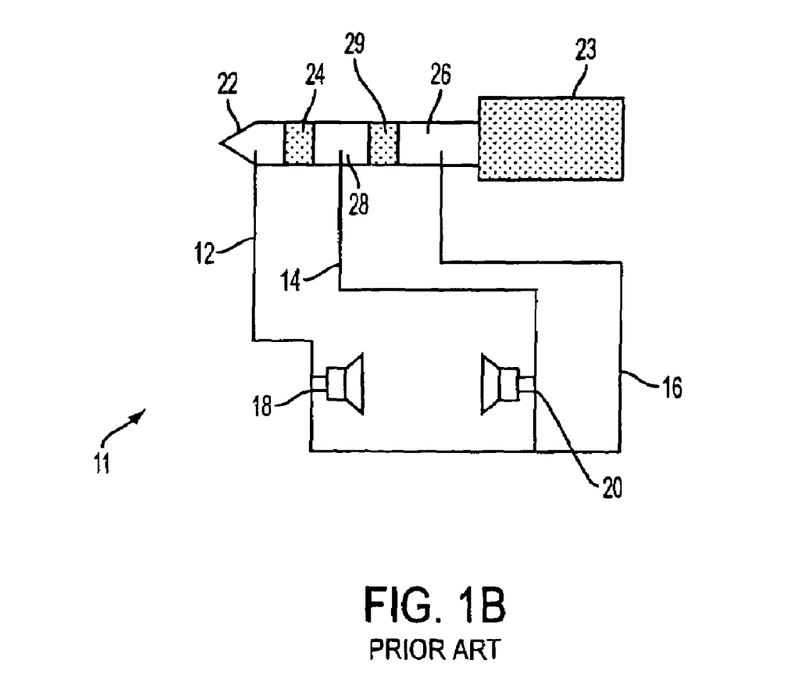
FIG. 1B illustrates a prior art stereo headphones design 11 using a 3-way "jack socket" design for connecting a pair of headphones to a stereo system.

PRIOR ART FIG. 1B illustrates a prior art stereo headphones system 11 using a 3-way "jack socket" design for connecting a pair of headphones to a stereo system. As shown in FIG. 1B, the 3-way jack-socket design 11 is made of three electrically isolated portions 22, 26, and 28, dividers 24 and 29, and a body 23. The design of the 3-way jack socket allows for the use of a single jack socket 11 to connect a pair of headphones via the leads 12 and 14 and the common ground lead 16. As illustrated herein PRIOR ART FIG. 1A, the 3-way jack-socket system 11 includes the tip 22, which couples the left headphone speaker to the stereo system via the lead 12. Similarly, the middle portion 28 of the jack socket 23 couples the right headphone speaker to the stereo system via the lead 14. A rear portion 26 of the jack socket 23 connects the common return for the left and the right headphones to a common ground 16 that may be connected to the stereo system chassis to form a common ground. Dividers 24 and 29 electrically isolate from each other, the various electrically charged portions 22, 26 and 28 of the 3-way jack-socket.

Each headphone may be represented by a resistive headphone load to be driven by the incoming signals. Typical value for the resistive load of a headphone speaker is in 16 to 32 Ω (ohm) range.

Figure 2:
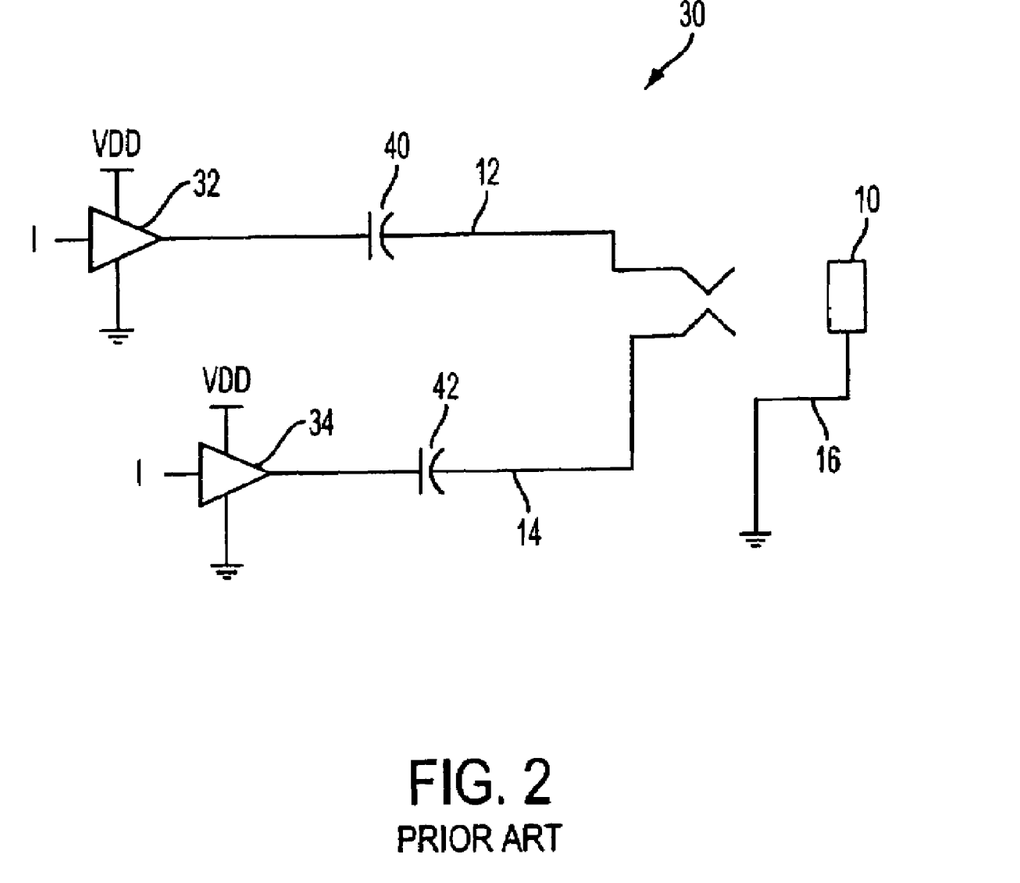
FIG. 2 illustrates a typical prior art headphone driver amplifier circuit.

PRIOR ART FIG. 2 illustrates a typical headphone driver amplifier circuit 30. The headphone driver amplifier circuit 30 includes a pair of headphone amplifiers 32 and 34, a pair of DC coupling capacitors 40 and 42, and a pair of outputs leads 12 and 14 connecting the headphone amplifiers to the headphone speakers represented by the headphone load 10.

As shown in PRIOR ART FIG. 2, the incoming (driving) signals are amplified before reaching each headphone. In the cases where the headphones are used with portable electronic devices such as portable cassette players or portable CD players, a single positive power supply such as a battery is the only source of power. In a typical portable device, headphone driver amplifiers are from a single supply (e.g. a 5 volts or 3.3 volts battery). In order to accurately reflect the incoming signals amplified by the headphone amplifiers 32 and 34, the outputs of the headphone amplifiers 32 and 34 are biased at mid-rail ($V_{DD}/2$) allowing for the generation of both positive and negative going signals without clipping. As a result, the output of the amplifiers 32 and 34 are at a higher DC voltage with respect to ground.

In order to prevent high currents from flowing through the headphones and having the headphones in a continuously on state, direct current (DC) coupling capacitors such as 40 and 42 are inserted in series with the output of the amplifiers 32 and 34, in order to prevent a DC current from reaching the headphones. The DC coupling capacitors 40 and 42 act as a high pass filter preventing DC and very low frequency signals from reaching the headphones. In order to reproduce low frequency input signals into the 16–32 Ω (ohm) load of a typical headphone, the value of these DC coupling capacitors needs to be in the 100–470 μF (micro Farad) range. However, the physical size of a 100–470 μF capacitor is prohibitively large and prevents miniaturization of the headphone circuitry. The physical size and cost of these DC blocking capacitors 40 and 42 is of a greater importance in the design of portable equipment and therefore implementing an amplifier topology that either completely eliminates the DC blocking capacitors or reduces their value and size is desirable.

Returning to PRIOR ART FIG. 2, the incoming signal I is input to the two power amplifiers 32 and 34. In order to generate positive and negative going incoming signals without signal clipping, the amplifiers 32 and 34 are typically biased at mid-rail (VDD/2), and thus the positive and negative power supply terminals of the two amplifiers 32 and 34 are connected to the positive power supply VDD and ground (VSS) respectively. As a result, the outputs 36 and 38 of the input amplifier 32 and 34 need to be coupled to the left and right headphones through DC blocking capacitors 40 and 42 respectively. As previously discussed, in order to reproduce low frequencies into the typical 16 to 32 ohm headphones, the size of the DC blocking capacitors has to be in 100 to 470 μF range. The physical dimensions for these internal capacitors is very large and the size prevents the much desired miniaturization of the headphone driver amplifier circuit 30.

Figure 3:
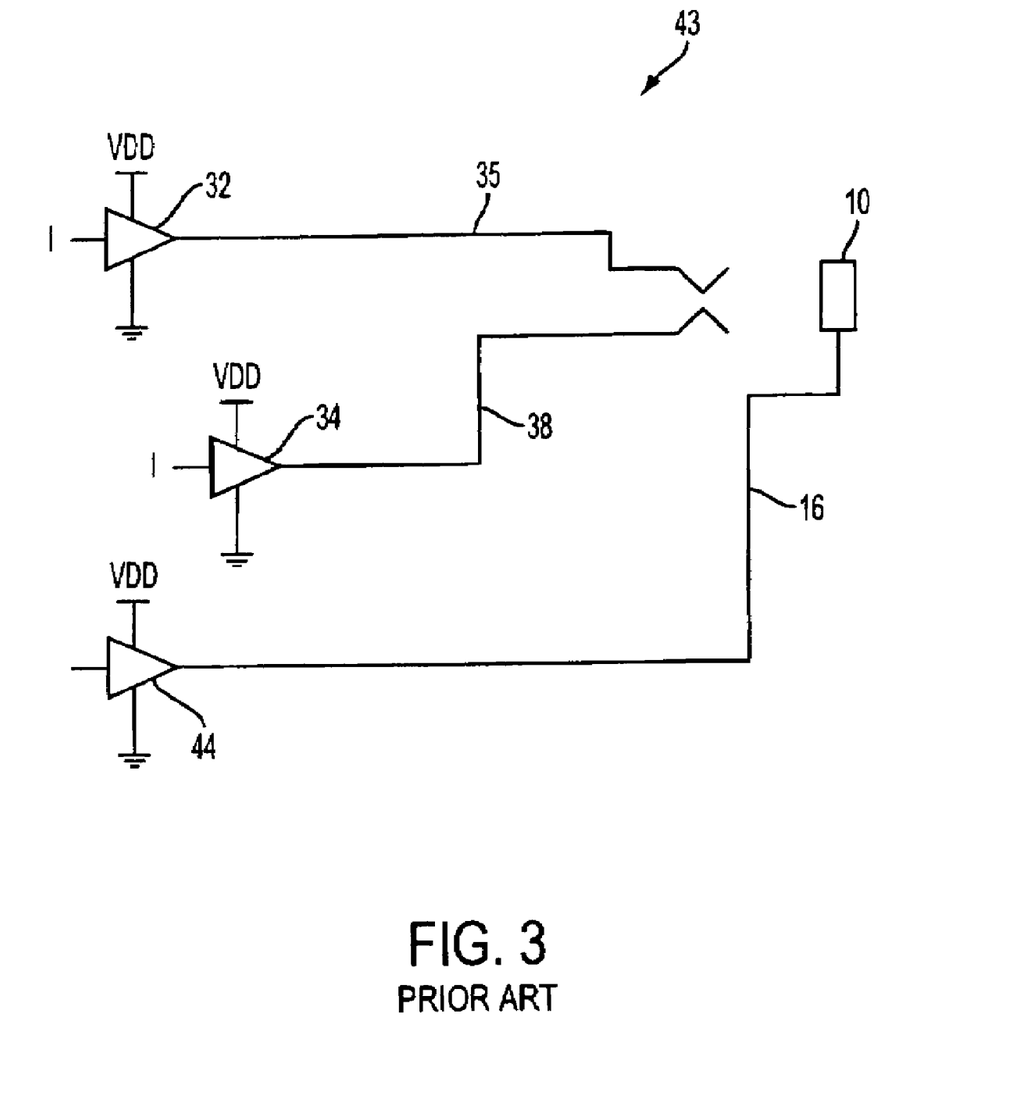
FIG. 3 illustrates one prior art solution eliminating the need for DC coupling capacitors.

PRIOR ART FIG. 3 illustrates one prior art solution eliminating the need for DC coupling capacitors. A prior art driver amplifier circuit 43 includes a pair of headphone amplifiers 32 and 34 directly coupled to a headphone load 10 through a pair of leads 36 and 38, and a third amplifier 44 connected to the headphone load 10 via the lead 16. The headphone load 10 (representing the headphones) is biased between ground (GND) and the supply voltage VDD. With both headphone amplifiers biased to approximately the same DC value, very little DC current flows through the headphones, and the third amplifier sinks or sources current as necessary. Although the circuit depicted in PRIOR ART FIG. 3 eliminates the need for large DC coupling capacitors, this system has the disadvantage of having a common return 16 that must now be isolated from the equipment chassis since it has a DC voltage on it. This isolation introduces additional problems such as possible circuit damage if the electrical isolation of the common return from the rest of the system fails.

Therefore, it is desirable to provide a direct drive amplifier system that operates from a single voltage supply, and which does not require the usual large DC coupling capacitors or need the physical isolation of the common return of the amplifier.

BRIEF DESCRIPTION OF THE DRAWINGS

PRIOR ART

PRIOR ART

PRIOR ART

PRIOR ART

DETAILED DESCRIPTION OF THE PREFERRED EMBODIMENTS

Prior art amplifier driver systems for video and audio devices that operate from a single power supply require biasing the output at mid-range of the power supply in order to fully represent the incoming signal without the danger of any clipping. As a result, these prior art systems require that DC blocking capacitors be used in series with the amplifiers driving the output. The value and physical size of these DC coupling capacitors are prohibitively large and limit miniaturization, which is highly desired in most systems.

One aspect of the present invention allows for driver amplifier circuits that operate from a single voltage supply, without requiring the usual series coupling capacitors necessary for preventing DC current from reaching the output. An on-board power supply generates a negative voltage rail, which powers the output amplifiers, allowing driver amplifier operation from both positive and negative rails. In this way, the amplifier can be biased at ground (0 volts) potential, generating no significant DC voltage across the output load (speakers, video device, etc.).

Figure 4:
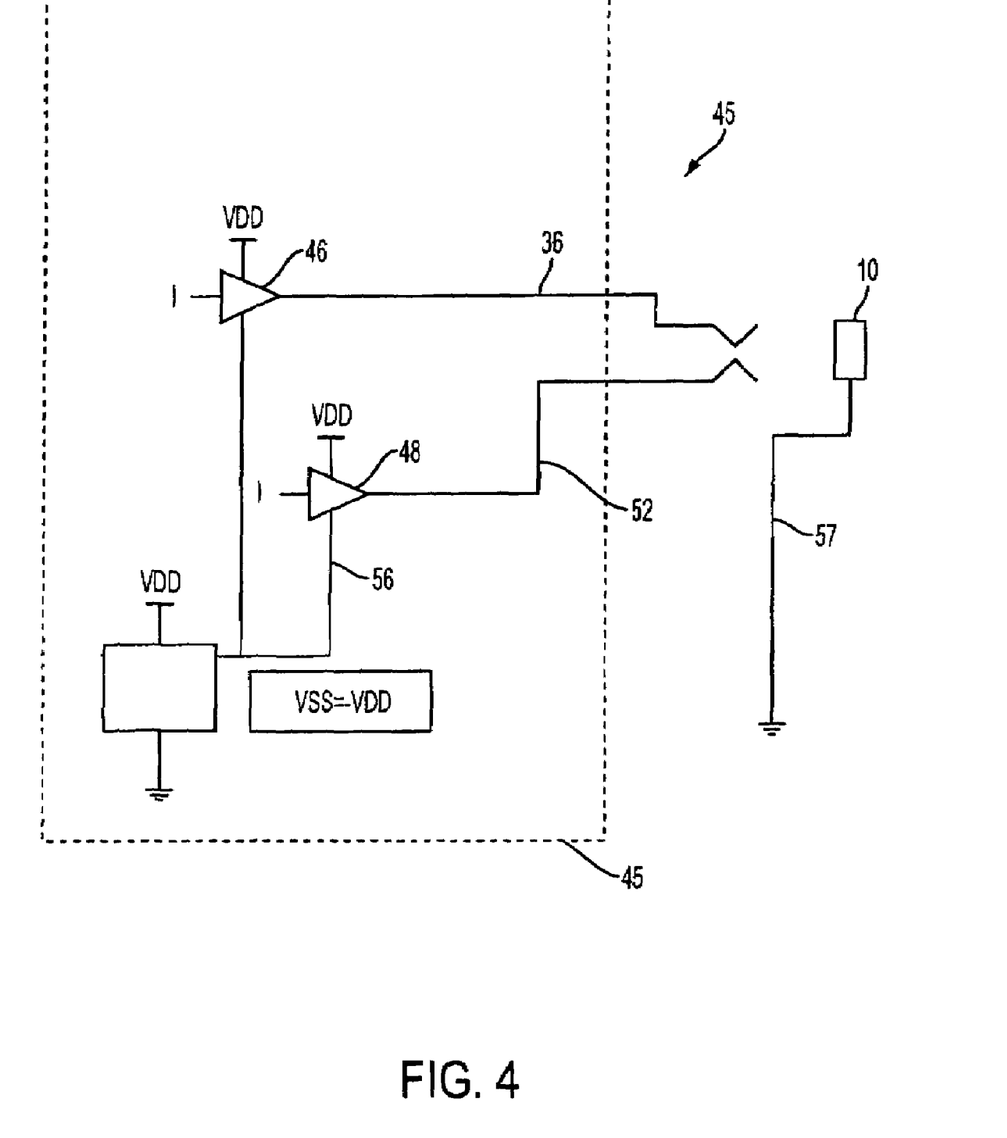
FIG. 4 illustrates a headphone amplifier circuit according to the present invention.

FIG. 4 illustrates a headphone amplifier circuit 45 according to the present invention. The headphone amplifier circuit 45 includes a first amplifier 46 driving the left headphone, a second amplifier 48 driving the right headphone, each amplifier coupled to its respective headphone load 10 via a connecting lead 50 and 52 respectively, and a charge pump 54. The headphones represented by the headphone load 10 are connected to a common ground 57. As shown in FIG. 4, instead of a third amplifier 44 shown in PRIOR ART FIG. 3 a charge pump circuitry 54 is used.

The term "charge pump" refers to a type of DC voltage-to-voltage converter that uses capacitors, and in an alternative embodiment inductors, to store and transfer energy. One type of charge pump (also referred to as switched-capacitor converters) includes a switch/diode network that charges and discharges one or more capacitors. Alternatively, in implementing the present invention, a DC voltage-to-voltage converter may be used that includes an inductor.

The charge pump circuitry of the present invention generates a negative voltage rail −VDD with respect to ground, powering the output amplifiers and allowing driver amplifier operation from both positive and negative rails. Providing a negative voltage rail with respect to ground allows for the headphone amplifiers to be biased at ground voltage, allowing for the incoming signals to be amplified without clipping. As shown in FIG. 4, the two headphone amplifiers 46 and 48 have their positive power terminal connected to VDD, the positive voltage supply, and VSS, which is approximately equal to the negative value of VDD with respect to ground. This arrangement allows for the output terminal of both amplifiers 46 and 48 to be biased to ground, resulting in no significant DC voltage across the headphones and allowing the elimination of the large DC coupling capacitors 40 and 42 as shown in PRIOR ART FIG. 2.

Returning to FIG. 4, each of the headphone amplifiers 46 and 48 has one lead of its supply voltage terminal connected to the positive voltage rail VDD and another lead of its supply voltage terminal connected to the output 56 of the charge pump circuitry 54 supplying a negative voltage VSS equal to −VDD.

The headphone amplifier circuit 45 allows for the headphone 10 to be biased at zero volts, operating between VDD and −VDD which in turn allows for the leads 50 and 52 of the respective headphone amplifiers 46 and 48 to directly couple the headphone speakers 10 to the headphone amplifiers 46 and 48 without the need for any DC coupling capacitors in series.

Figure 5:
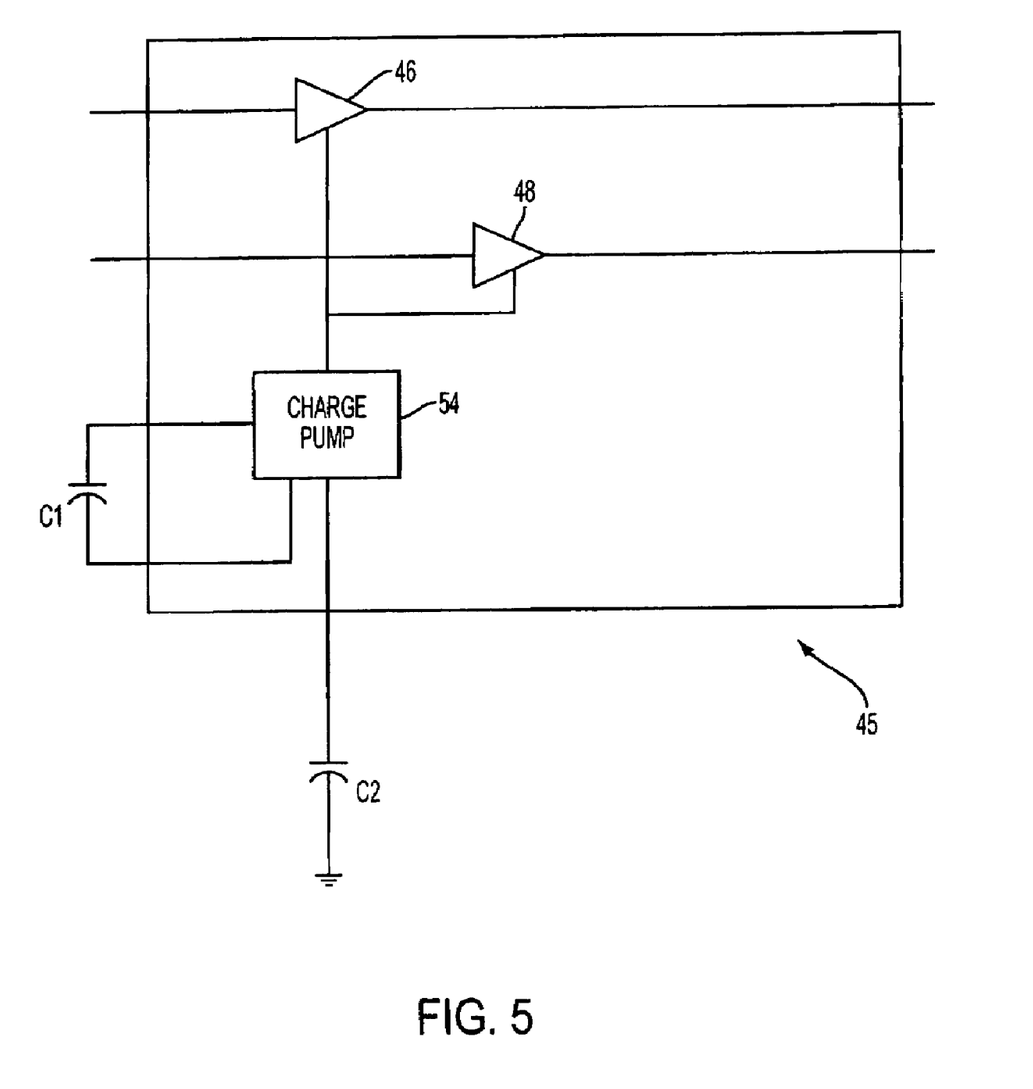
FIG. 5 illustrates one embodiment of the headphone amplifier system of the present invention in a circuit.

FIG. 5 illustrates one embodiment of the headphone amplifier system of the present invention in a circuit. The headphone amplifier system 145 includes a left headphone amplifier 46, a right headphone amplifier 48, a charge pump 54, and external capacitors C1 and C2. As shown in FIG. 5, in one embodiment of the present invention, the charge pump circuitry 54 and the power amplifiers 46 and 48 are implemented on a single integrated circuit (IC) chip 145. In this example, the charge pump 54 operation requires two small external capacitors C1 and C2. C1 is a called a "flying capacitor" and C2 is a "reservoir capacitor". The size of these two external capacitors are in the single digit micro Farad (µF) range as compared to the DC coupling capacitors of the prior art which are in the several hundred µF range.

Figure 6:
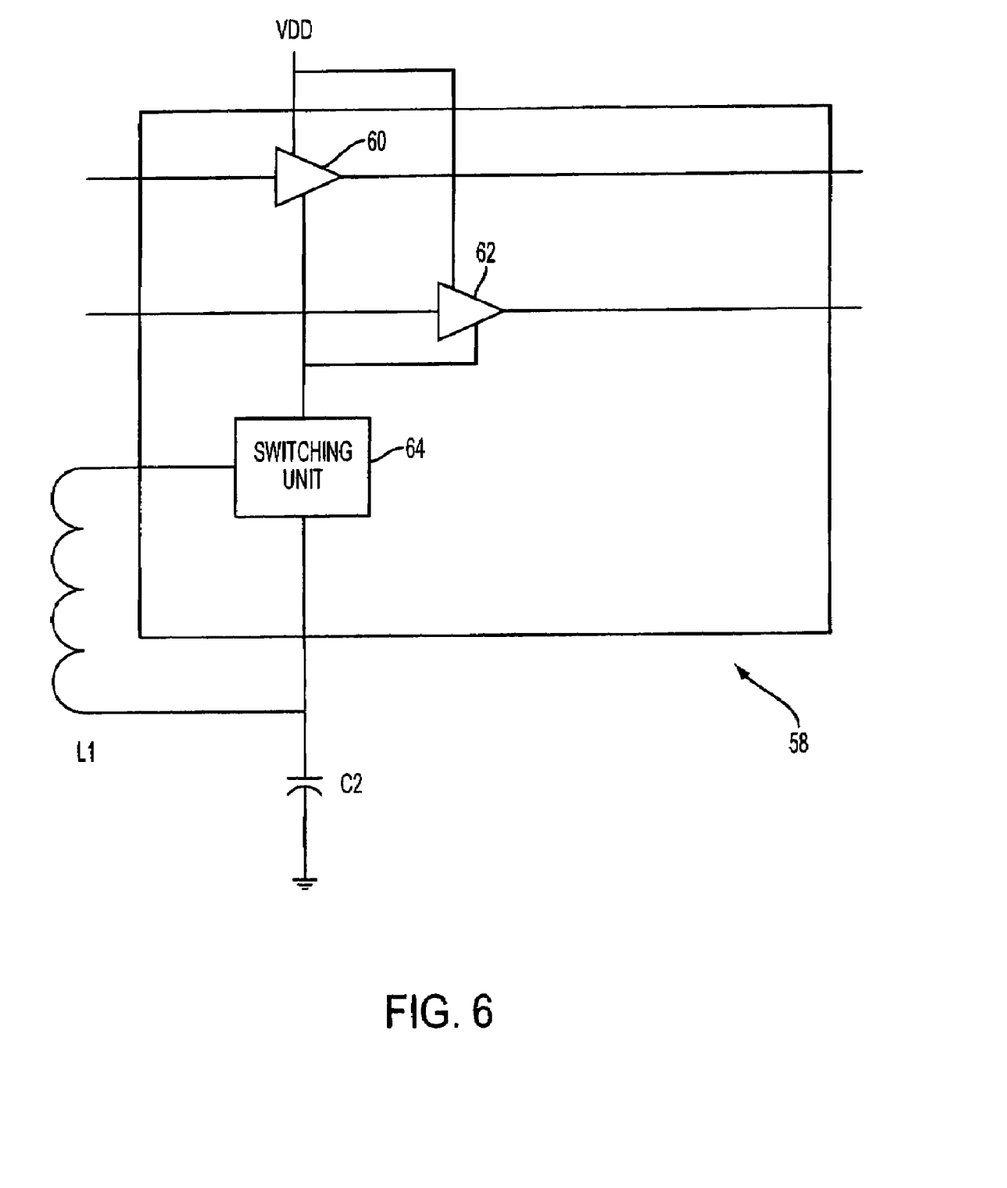
FIG. 6 is an illustration of an alternative embodiment of a headphone amplifier system according to the present invention.

FIG. 6 is an illustration of an alternative embodiment of a headphone amplifier system according to the present invention. As shown in FIG. 6, the headphone driver circuit 58 includes a first amplifier 60, a second amplifier 62, a switching unit 64, an external inductor L1 and an external capacitor C2. The inventive teachings of the present invention may further be implemented using an inductor based DC voltage-to-voltage converter. In one embodiment, the headphone driver circuit 58 may be implemented using discrete circuit components. In an alternative embodiment, an onboard inductor $L_1$ may be used in conjunction with an integrated circuit that includes an integrated switching system as well as power amplifiers for driving the headphones. In this embodiment, an external inductor L1 is used in conjunction with an external capacitor $C_1$ to convert a positive power supply voltage to a substantially equal but negative voltage supply. A switching unit 64 configures the circuit for each charge and discharge cycle. The headphone amplifiers 60 and 62 may be directly coupled to and drive their respective headphones without the need for DC coupling capacitors since the headphones are biased to ground and operate between VDD and −VDD, allowing for a complete incoming signal representation without any clipping.

Figure 7:
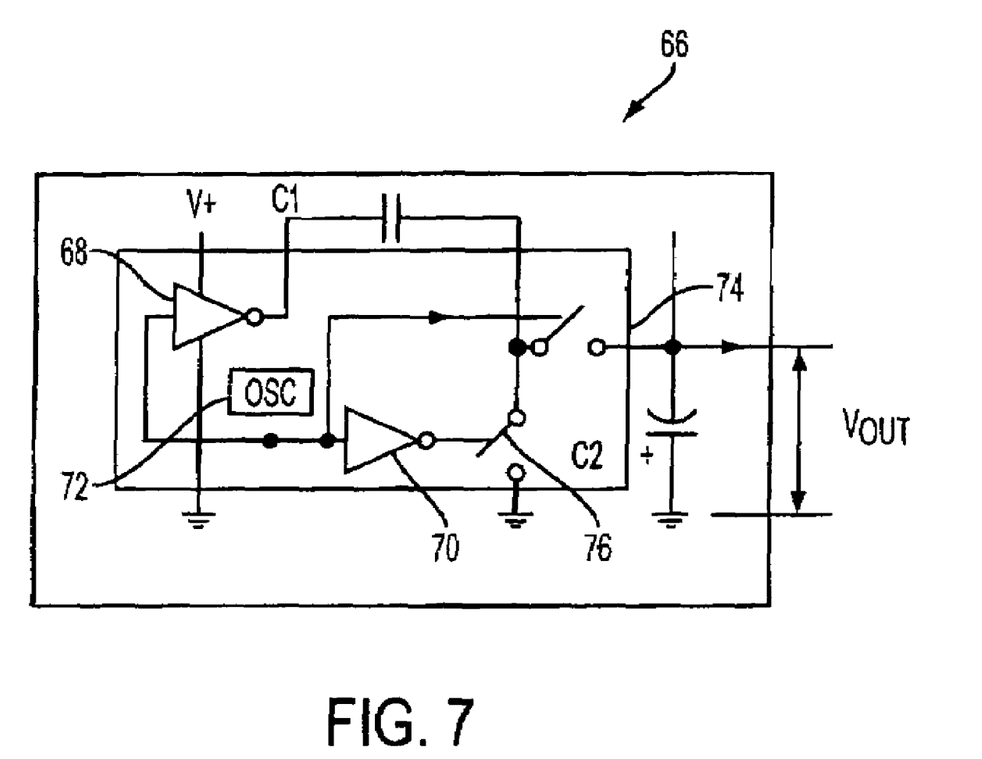
FIG. 7 illustrates a simple capacitor based, IC charge pump circuitry.

FIG. 7 is illustrates a simple capacitor-based, IC charge pump circuitry 66. The simple capacitor based IC charge pump circuitry 66 includes a pair of amplifier/inverters 68 and 70, an oscillator 72, a pair of switches 74 and 76, and a pair of external capacitors C1 and C2.

In the simple capacitor based IC charge pump circuitry 66, the switch network 74 and 76 toggles between charge and discharge states. An oscillator (OSC) 72 controls the two switches (74 and 76) that alternately charge a flying capacitor (C1) from an input voltage supplied by the amplifier 68 and 70, and discharge the flying capacitor (C1) into an output capacitor (C2). The voltage thus produced across the output capacitor C2 may be output as the output voltage (VOUT). Typically, the oscillator 72, the switches 74 and 76, and still other controls are all commonly contained in a single integrated circuit (IC).

The simple capacitor based IC charge pump circuitry 66 is of the inverting type, and it operates by lowering the potential of the charge in the flying capacitor C1 below ground, and then discharging the output capacitor C2 with this. The optimal result of this is an output voltage VOUT that is the negative of the input voltage.

One very common type of inverting charge pump operates in this way, but further includes an appreciable resistance in the charge path to the flying capacitor. The resistance intentionally introduces a delay in the charging of the flying capacitor, and appropriate control of the oscillator is then used to switch the charge before it is able to reach the full input voltage potential. This type of charge pump may accordingly transfer charge quanta having only one-half, two-thirds, etc. of the input voltage, and thereby produce an output voltage which is correspondingly lower than the input voltage. This type of step-down charge pump is probably overwhelmingly the most common today, but it is not the only type possible. Alternative circuit arrangements allow for the generation of an output voltage VOUT that is equal to some negative quanta of the input voltage.

Figure 8:
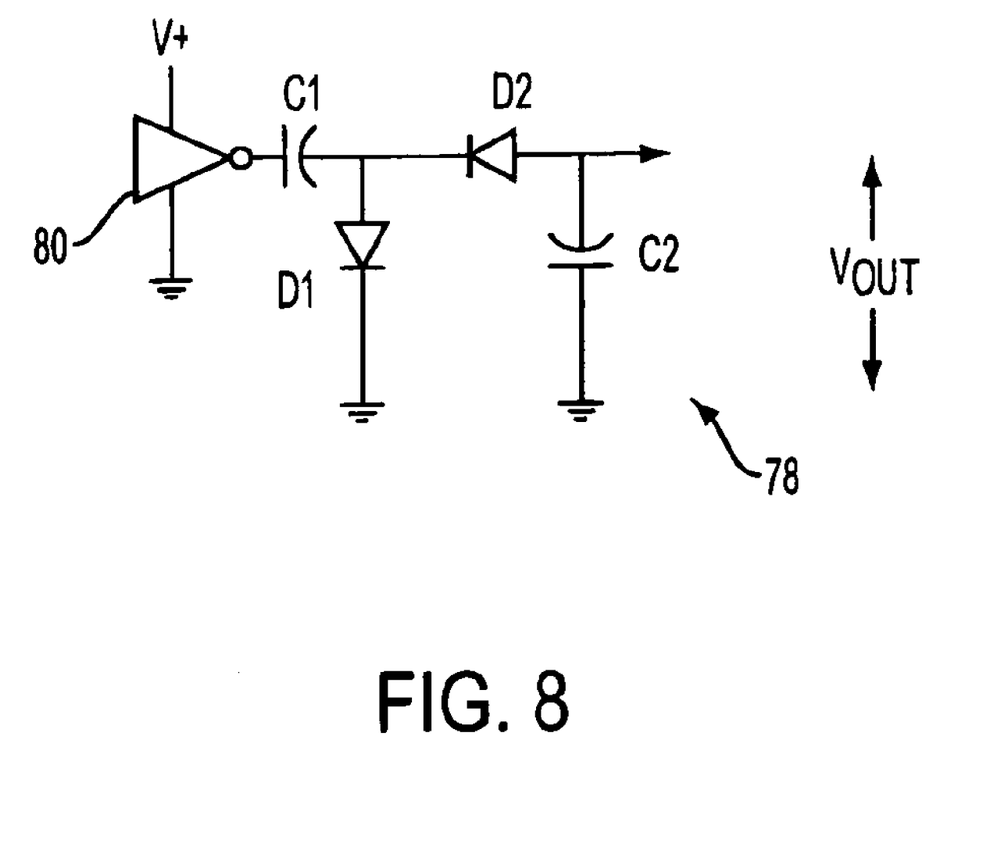
FIG. 8 illustrates a simple capacitor based discrete charge pump circuitry.

FIG. 8 illustrates a simple capacitor based discrete charge pump circuitry. The simple capacitor based discrete charge pump circuitry 78 includes an amplifier 80, a pair of capacitors C1 and C2, a pair of diodes or switches D1 and D2 and includes an input signal or external clock. In the capacitor based discrete charge pump circuit 78, the basic charge pump circuit is implemented in a discrete component circuit as shown in FIG. 8. When the output of the amplifier 80 is approximately V+, the amplifier 80 charges the flying capacitor C1 through the diode D1. When the output of amplifier 80 is approximately ground, the capacitor C1 discharges the capacitor C2 through the diode D2. A reservoir capacitor C2 holds the charge and filters the output voltage VOUT. The external clock signal along with the two diodes D1 and D2 control the cycle and direction of the charge and discharge signals.

Figure 9:
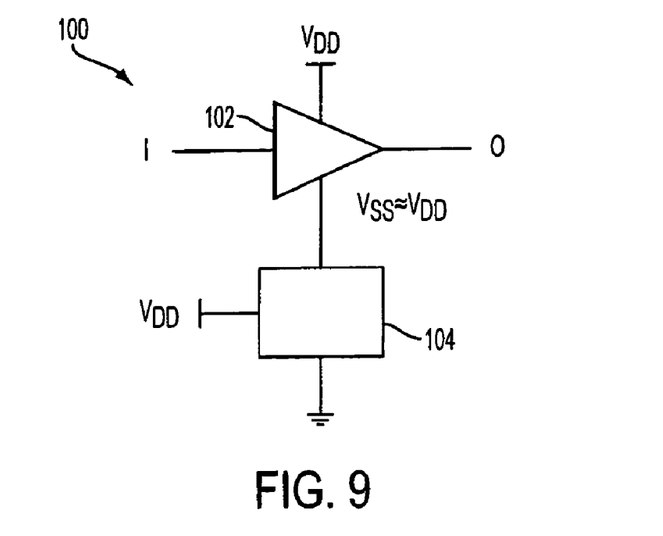
FIG. 9 illustrates a direct drive amplifier operating from a single supply and utilizing a charge pump to generate a negative rail supply.

FIG. 9 illustrates a single supply direct drive circuit 100 having a single output in accordance with one embodiment of the present invention. The circuit 100 includes an amplifier 102 and a DC-to-DC voltage converter 104. The amplifier 102 may be well suited for driving a video load, as described below with reference to FIG. 10. The voltage converter 104 may be any suitable device such as a capacitive based charge pump, an inductor based converter, etc. Such devices are described above in more detail. In contrast with the headphone examples of FIGS. 1–8, the embodiment of FIG. 9 can be used in a context where only a single output signal is necessary. In particular, a video amplifier is contemplated.

Figure 10:
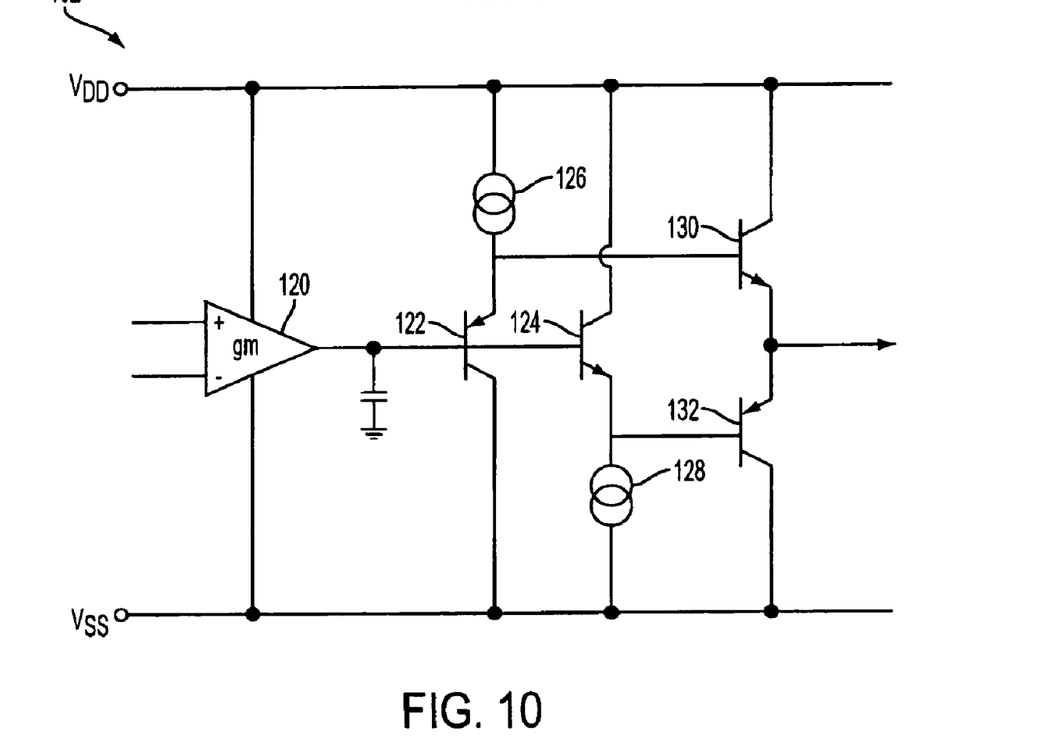
FIG. 10 illustrates a suitable architecture for a video amplifier in accordance with one embodiment of the present invention.

FIG. 10 illustrates one suitable embodiment for the amplifier 102 of FIG. 9. As will be appreciated, the architecture of FIG. 10 is straight-forward and well suited for driving a video load. The amplifier 102 includes a transconductance stage 120, first and second parallel coupled transistors 122 and 124, a current device 126 sourcing current to the first parallel coupled transistor 122, a current device 128 sinking current from the second parallel coupled transistor 124, and first and second output transistors 130 and 132. In one embodiment, the transconductance stage includes a degenerated differential pair of transistors.

Figure 11:
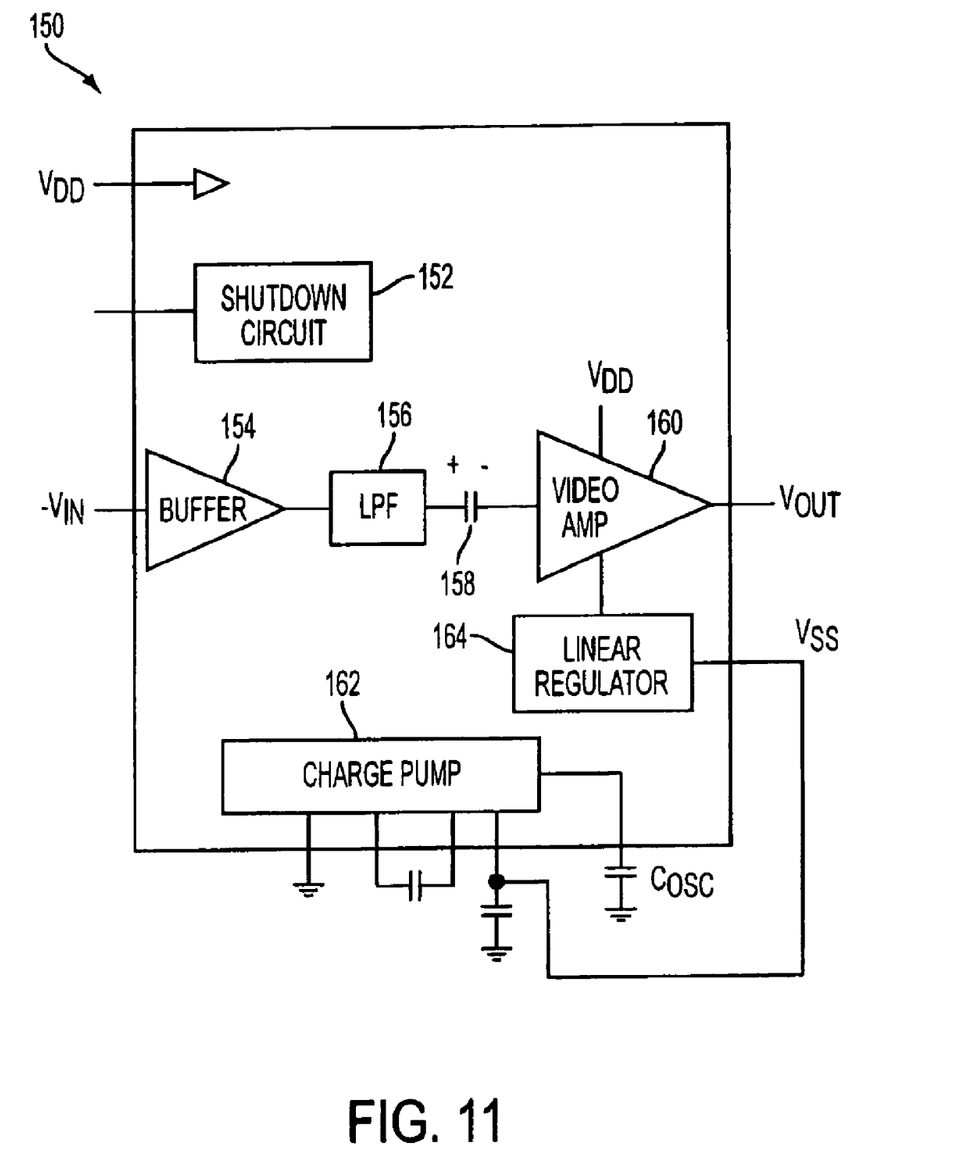
FIG. 11 illustrates an operating diagram for a single supply direct drive video amplifier of the present invention implemented on an integrated circuit.

FIG. 11 illustrates an operating diagram of a single supply direct drive video circuit in accordance with one embodiment of the present invention as an integrated circuit package 150. Although certain connections are not shown, those skilled in the art will readily understand operation of the video circuit from the diagram. The IC 150 includes a shutdown circuit, a buffer amplifier 154, a low pass or reconstruction filter 156, a DC level shift capacitor 158, a video amplifier 160, a charge pump 162, and a linear regulator 164. The low pass filter 156 should provide the desired filter response for the application, and may be a 3-pole or 4-pole filter. The video amplifier 160 and the charge pump 162 can take any suitable form such as those described earlier. The charge pump 16 or other negative voltage supply generator may create a "noisy" negative voltage supply. Accordingly, the linear regulator 164 is an optional component that can be included to provide the video amplifier with a quiet negative voltage supply. The IC 150 provides a single supply video amplifier without the need for the bulky, expensive external capacitors of the prior art.

The foregoing examples illustrate certain exemplary embodiments of the invention from which other embodiments, variations, and modifications will be apparent to those skilled in the art. As will be further appreciated, the circuit of the present invention is well suited for use in portable applications such as cellular telephones, digital cameras, portable computers, etc. The invention should therefore not be limited to the particular embodiments discussed above, but rather is defined by the following claims.

We claim:

1. A circuit enabling a driver amplifier to operate from a single voltage supply comprising:

an amplifier having an output arranged for coupling to an output load, said amplifier having first and second power supply leads, said first power supply lead connected to a power supply voltage; and a DC voltage-to-voltage converter having an output, said DC voltage-to-voltage converter having a power source lead connected to the power supply voltage, the output of said DC voltage-to-voltage converter connected to the second power supply lead, and said DC voltage-to-voltage converter generating an output voltage at the output that is substantially equal in magnitude to some negative quanta of the power supply voltage, wherein said DC voltage-to-voltage converter is an inductor-based voltage-to-voltage converter.

2. The circuit of claim 1 connected to a common ground by two external capacitors in the range of 0.47 to 3.3 micro farads.

3. The circuit of claim 1, wherein the driver amplifier is particularly suited for driving an audio output load.

4. The circuit of claim 3, wherein the audio output load is a portable headphone device.

5. The circuit of claim 1, wherein the driver amplifier is particularly suited for driving a video output load.

6. A direct drive circuit enabling a driver amplifier to operate from a single voltage supply comprising:
   an amplifier having an output driving a load, said amplifier having a first and a second power supply lead, said first power supply lead connected to a supply voltage, said amplifier including a transconductance stage comprised of a degenerated differential pair of transistors;
   a DC voltage-to-voltage converter circuitry having an output, said DC voltage-to-voltage converter circuitry having a power source lead connected to the supply voltage, the output of said DC voltage-to-voltage converter circuitry connected to the second power supply lead and said output being substantially equal in magnitude to some negative quanta of the power supply voltage;
   first and second parallel coupled transistors driven by the transconductance stage, the first parallel coupled transistor coupled to a current source device, and the second parallel coupled transistor coupled to a current sink device; and
   first and second output transistors, the first output transistor driven by the remainder of current not consumed by said first parallel coupled transistor, and the second output transistor driven by the remainder of current not consumed by said current sink device.

7. The circuit of claim 6, wherein the amplifier is well-suited for use as a video amplifier.

8. The circuit of claim 6, wherein the circuit is formed as an integrated circuit.

9. The circuit of claim 6 further comprising a low pass filter coupled in series between an input voltage and an input of said transconductance stage.

10. The circuit of claim 9 further comprising a buffer amplifier coupled between said input voltage and an input of said low pass filter.

11. The circuit of claim 6 further comprising a shutdown circuit operable to cease operation of said direct drive circuit.

12. A single supply direct drive video amplifier formed on an integrated circuit, said single supply direct drive video amplifier comprising:
   an amplifier having an output for driving a video load, said amplifier having first and second power supply leads, said first power supply lead connected to a power supply voltage, said amplifier including;
   a transconductance stage comprised of a degenerated differential pair of transistors;
   first and second parallel coupled transistors driven by the transconductance stage, the first parallel coupled transistor coupled to a current source device, and the second parallel coupled transistor coupled to a current sink device; and
   first and second output transistors, the first output transistor driven by the remainder of current not consumed by said first parallel coupled transistor, and the second output transistor driven by the remainder of current not consumed by said current sink device;
   a low pass filter coupled in series between an input voltage and an input of said transconductance stage;
   a buffer amplifier coupled between said input voltage and an input of said low pass filter;
   a shutdown circuit operable to cease operation of said direct drive circuit; and
   a DC voltage-to-voltage converter circuitry having an output, said DC voltage-to-voltage converter circuitry having a power source lead connected to the power supply voltage, the output of said DC voltage-to-voltage converter circuitry connected to the second power supply lead and said output being substantially equal in magnitude to some negative quanta of the power supply voltage;
   wherein said single supply direct drive video amplifier is formed as an integrated circuit.

13. The amplifier of claim 12 wherein the DC voltage-to-voltage converter is a charge pump.

14. The amplifier of claim 12 wherein the DC voltage-to-voltage converter is an inductor based voltage-to-voltage converter.

15. The amplifier of claim 12 wherein a linear regulator is coupled in between the output of the DC voltage-to-voltage converter circuitry and the second power supply lead, the linear regulator operable to reduce noise in a signal generated by the DC voltage-to-voltage converter circuitry.

16. A circuit enabling a driver amplifier to operate from a single voltage supply comprising:
   an amplifier having an output arranged for coupling to an output load, said amplifier having first and second power supply leads, said first power supply lead connected to a power supply voltage;
   a charge pump having an output, said charge pump having a power source lead connected to the power supply voltage, and said charge pump generating an output voltage at the output that is substantially equal in magnitude to some negative quanta of the power supply voltage; and
   a linear regulator having an input and an output, the output of the charge pump connected to the input of the linear regulator, and the output of the linear regulator coupled to the second power supply lead of the amplifier.

17. The circuit of claim 1 wherein the output of the amplifier is coupled to the output load without an intervening DC coupling capacitor.

18. The circuit of claim 6 wherein the output of the amplifier is coupled to the load without an intervening DC coupling capacitor.

19. The circuit of claim 12 wherein the output of the amplifier is coupled to the video load without an intervening DC coupling capacitor.

20. The circuit of claim 16 wherein the output of the amplifier is coupled to the output load without an intervening DC coupling capacitor.

* * * * *